(12) United States Patent
Chen et al.

(10) Patent No.: US 9,524,785 B2
(45) Date of Patent: Dec. 20, 2016

(54) MEMORY UNIT WITH VOLTAGE PASSING DEVICE

(71) Applicant: eMemory Technology Inc., Hsin-Chu (TW)

(72) Inventors: Chih-Hsin Chen, Changhua County (TW); Shih-Chen Wang, Taipei (TW); Tsung-Mu Lai, Hsinchu County, TN (US)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/065,878

(22) Filed: Mar. 10, 2016

(65) Prior Publication Data

US 2016/0293261 A1   Oct. 6, 2016

Related U.S. Application Data

(60) Provisional application No. 62/141,282, filed on Apr. 1, 2015.

(51) Int. Cl.
| | | |
|---|---|---|
| *G11C 16/14* | (2006.01) | |
| *G11C 16/10* | (2006.01) | |
| *G11C 16/04* | (2006.01) | |
| *G11C 16/26* | (2006.01) | |

(52) U.S. Cl.
CPC ........... *G11C 16/14* (2013.01); *G11C 16/0441* (2013.01); *G11C 16/10* (2013.01); *G11C 16/26* (2013.01); *G11C 2216/10* (2013.01)

(58) Field of Classification Search
CPC ..................... G11C 16/0433; H01L 27/11524
See application file for complete search history.

(56) References Cited

U.S. PATENT DOCUMENTS

| | | | |
|---|---|---|---|
| 5,986,931 A * | 11/1999 | Caywood | H01L 27/115 257/E27.103 |
| 6,963,503 B1 | 11/2005 | Rahim | |
| 7,239,558 B1 | 7/2007 | Poplevine | |
| 8,111,558 B2 * | 2/2012 | Pesavento | G11C 11/005 365/185.18 |
| 2012/0236646 A1 | 9/2012 | Hsu | |
| 2015/0001608 A1 * | 1/2015 | Tan | H01L 29/42324 257/321 |

* cited by examiner

*Primary Examiner* — R Lance Reidlinger
(74) *Attorney, Agent, or Firm* — Winston Hsu; Scott Margo

(57) ABSTRACT

A memory cell includes a floating gate transistor, a word line transistor, a first capacitance element, and a second capacitance element. The floating gate transistor has a first terminal for receiving a bit line signal, a second terminal, and a floating gate. The word line transistor has a first terminal coupled to the second terminal of the floating gate transistor, a second terminal for receiving a third voltage, and a control terminal for receiving a word line signal. A voltage passing device is for outputting a second voltage during an inhibit operation and a first voltage during a program operation or an erase operation. The first capacitance element is coupled to the first voltage passing device and the floating gate, and for receiving a first control signal. The second capacitance element is for receiving at a second control signal.

24 Claims, 12 Drawing Sheets

MEMORY UNIT WITH VOLTAGE PASSING DEVICE

CROSS REFERENCE TO RELATED APPLICATIONS

This non-provisional application claims priority of U.S. provisional application 62/141,282, filed on Apr. 1, 2015, included herein by reference in its entirety.

BACKGROUND OF THE INVENTION

1. Field of the Invention

This invention relates to a memory unit, and more particularly, a memory unit with a voltage passing device.

2. Description of the Prior Art

An electrically rewritable nonvolatile memory is a type of memory that retains information it stores even when no power is supplied to memory blocks and allows on-board rewriting of a program. Due to the wide range of applications for various uses, there is a growing need for a nonvolatile memory to be embedded in the same chip with the main circuit, especially for personal electronic devices having strict requirement for circuit area.

A nonvolatile memory cell of prior art comprises one floating gate transistor for retaining data, and one or two select transistors for enabling the floating gate transistor to perform corresponding operations. Since all operations of the memory cell, including the program operation, the erase operation, the inhibit operation, and the read operation, are all controlled by the select transistors. Namely, the select transistors may have to operate with high voltages, and should be made of transistors with high threshold voltages.

However, due to the high threshold voltages of the select transistors, the read operation of the memory cell will require high voltage, which may slow down the reading process and cause unnecessary power consumption. Therefore, how to increase the reading process and reduce the reading voltage requirement has become an issue to be solved.

SUMMARY OF THE INVENTION

One embodiment of the present invention discloses a memory unit. The memory unit includes a first voltage passing device and a first memory cell. The first voltage passing device outputs voltages according to operations of the memory unit. The first memory cell includes a first floating gate transistor, and a first capacitance element.

The first floating gate transistor has a first terminal for receiving a first bit line signal, a second terminal, and a floating gate. The first capacitance element has a first terminal coupled to the first voltage passing device, a second terminal, a control terminal coupled to the floating gate of the first floating gate transistor, and a body configured to receive a first control signal The first capacitance element and the first voltage passing device are disposed in a first N-well. The first terminal of the first capacitance element receives a first voltage outputted from the first voltage passing device during a program operation or an erase operation of the first memory cell and receives a second voltage outputted from the first voltage passing device during an inhibit operation of the first memory cell. The first voltage is greater than the second voltage.

Another embodiment of the present invention discloses a memory array. The memory array includes at least one row of memory units. Each memory unit in a same row includes a first voltage passing device, a second voltage passing device, a first memory cell and a second memory cell.

The first voltage passing device is for receiving an inhibit signal, and output voltages according to a first passing gate control signal. The second voltage passing device is for receiving the inhibit signal, and output voltages according to a second passing gate control signal.

The first memory cell includes a first floating gate transistor, a first capacitance element, a first word line transistor, and a second capacitance. The first floating gate transistor has a first terminal configured to receive a first bit line signal, a second terminal, and a floating gate. The first capacitance element has a first terminal coupled to the first voltage passing device, a second terminal, a control terminal coupled to the floating gate of the first floating gate transistor, and a body configured to receive a first control signal. The first word line transistor has a first terminal coupled to the second terminal of the first floating gate transistor, a second terminal configured to receive a third voltage, and a control terminal configured to receive a word line signal. The second capacitance element is coupled to the floating gate of the first floating gate transistor, and is for receiving a second control signal.

The second memory cell includes a second floating gate transistor, a third capacitance element, a second word line transistor, and a fourth capacitance. The second floating gate transistor has a first terminal configured to receive a second bit line signal, a second terminal, and a floating gate. The third capacitance element has a first terminal coupled to the second voltage passing device, a second terminal, a control terminal coupled to the floating gate of the second floating gate transistor, and a body configured to receive the first control signal. The second word line transistor has a first terminal coupled to the second terminal of the second floating gate transistor, a second terminal configured to receive the third voltage, and a control terminal configured to receive the word line signal. The fourth capacitance element is coupled to the floating gate of the second floating gate transistor, and is for receiving the second control signal.

Memory units in a same row receive a same inhibit signal, a same first control signal, a same second control signal, and a same word line signal. Memory units in the same row receive different first bit line signals, different second bit line signals, different first passing gate control signals, and different second passing gate control signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
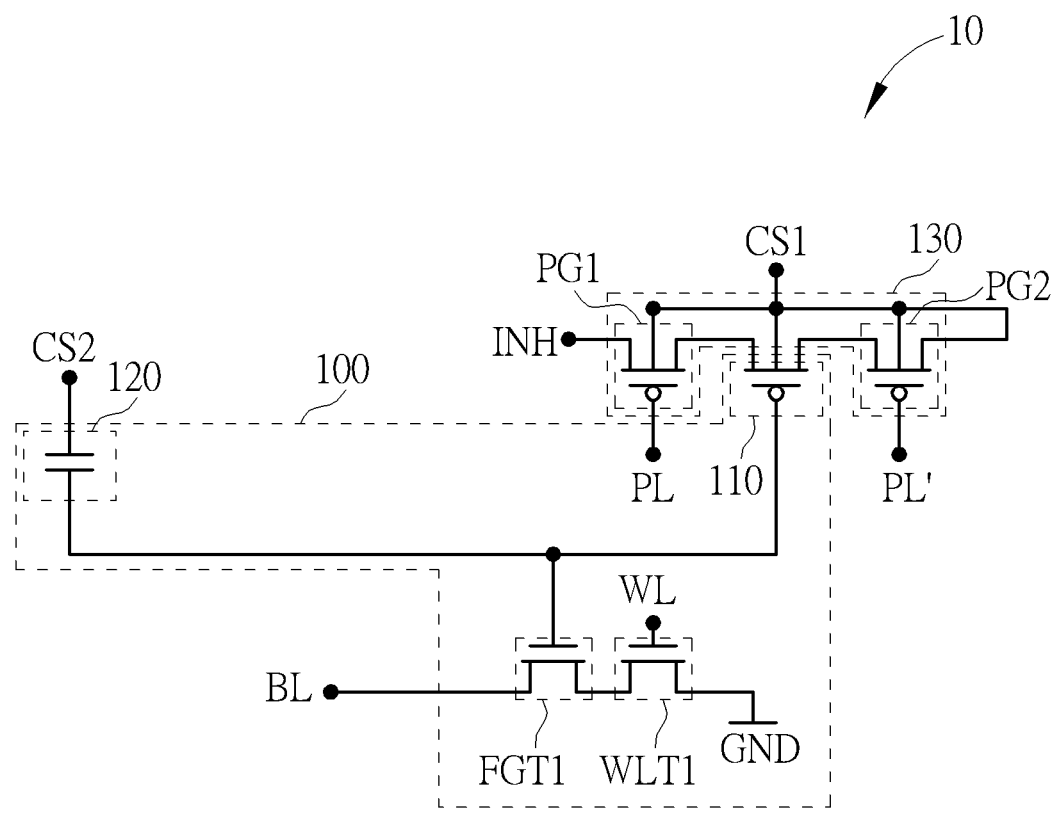
FIG. 1 shows a memory unit according to one embodiment of the present invention.

FIG. 1 shows a memory unit 10 according to one embodiment of the present invention. The memory unit 10 includes a first memory cell 100 and a first voltage passing device 130. The first memory cell 100 includes a first floating gate transistor FGT1, a first word line transistor WLT1, a first capacitance element 110, and a second capacitance element 120. The first voltage passing device 130 outputs voltages according to operations of the memory unit 10.

The first floating gate transistor FGT1 has a first terminal, a second terminal, and a floating gate. The first terminal of the first floating gate transistor FGT1 receives a first bit line signal BL. The word line transistor WLT1 has a first terminal, a second terminal, and a control terminal. The first terminal of the word line transistor WLT1 is coupled to the second terminal of the first floating gate transistor FGT1, the second terminal of the word line transistor WLT1 receives a third voltage GND, and the control terminal of the word line transistor WLT1 is for receiving a word line signal WL.

The first capacitance element 110 is coupled to the first voltage passing device 130 and the floating gate of the first floating gate transistor FGT1. The first capacitance element 110 can receive a first control signal CS1 and voltages outputted from the first voltage passing device 130. The second capacitance element 120 is coupled to the floating gate of the first floating gate transistor FGT1 and can receive a second control signal CS2. The first voltage passing device 130 can output different voltages to the first capacitance element 110 during different operations of the memory unit 10 and can help to inhibit the first memory cell 100 from being programmed or erased.

Figure 2:
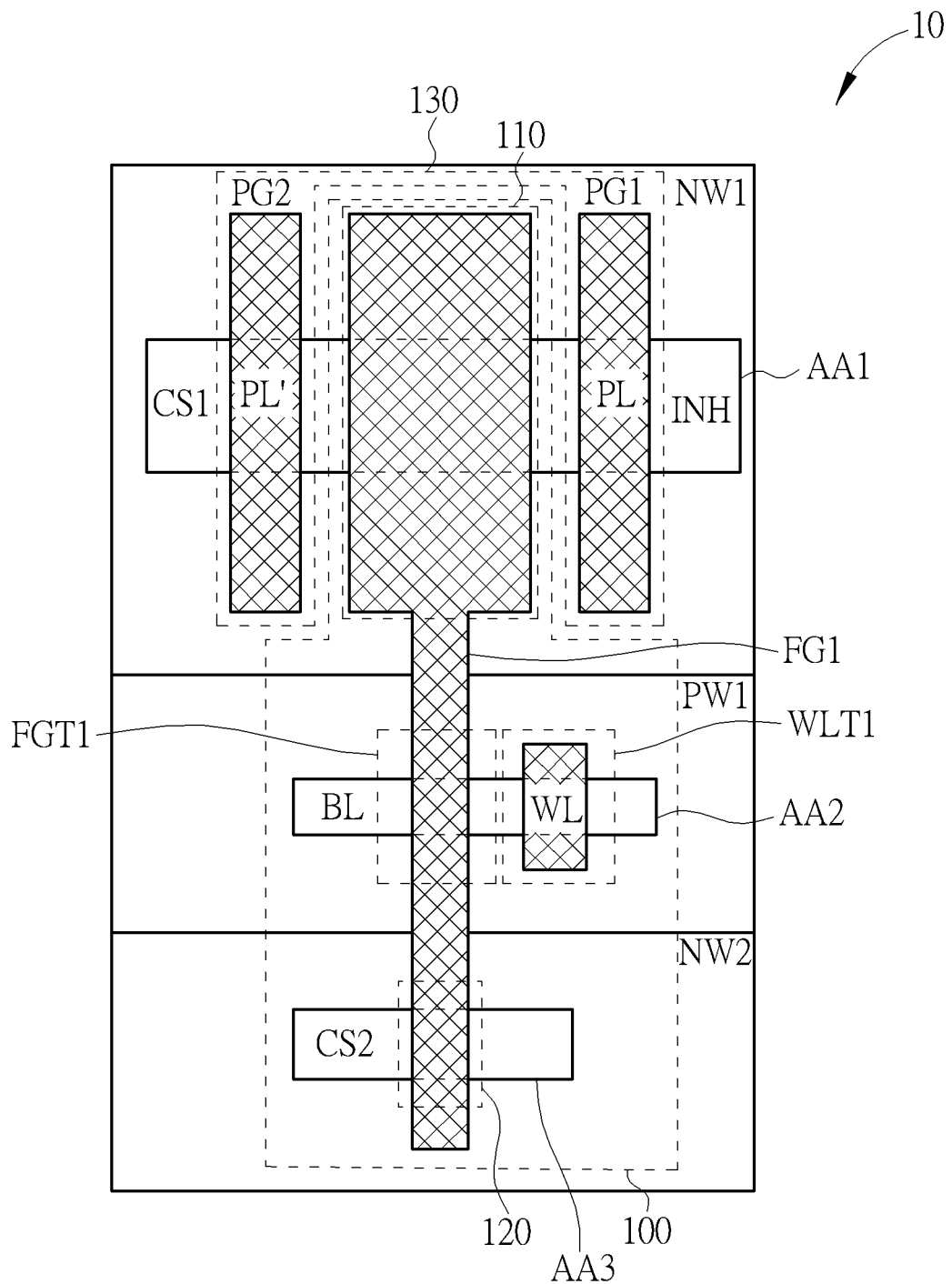
FIG. 2 shows a top view of the layout of the memory unit in FIG. 1 according to one embodiment of the present invention.

FIG. 2 shows a top view of the layout of the memory unit 10 according to one embodiment of the present invention. In FIG. 2, the first capacitance element 110 and the first voltage passing device 130 are substantially disposed in an active region AA1 in a first N-well NW1. The first floating gate transistor FGT1 and the first word line transistor WLT1 are partially disposed in an active region AA2 in a P-well PW1 adjacent to the first N-well NW1, and the second capacitance element 120 is substantially disposed in an active region AA3 in a second N-well NW2 adjacent to the P-well PW1. The active regions AA1, AA2, and AA3 may include doped regions to form structures of transistors required by the memory unit 10. The floating gate FG1 of the first floating gate transistor FGT1 extends to the first N-well NW1 and the second N-well NW2 to couple to the first capacitance element 110 and the second capacitance element 120. The first capacitance element 110 can receive the first control signal CS1 from the first N-well NW1 directly, and the second capacitance element 120 can receive the second control signal CS2 from the second N-well NW2 directly.

In FIG. 2, the area of the floating gate FG1 on the first capacitance element 110 is greater than the area of the floating gate FG1 on the second capacitance element 120. However, in other embodiments of the present invention, the ratio of the areas of the floating gate FG1 on the first capacitance element 110 and the second capacitance element 120 can be adjusted according to the system requirement for improving the efficiency of the program operation and/or the erase operation.

Figure 3:
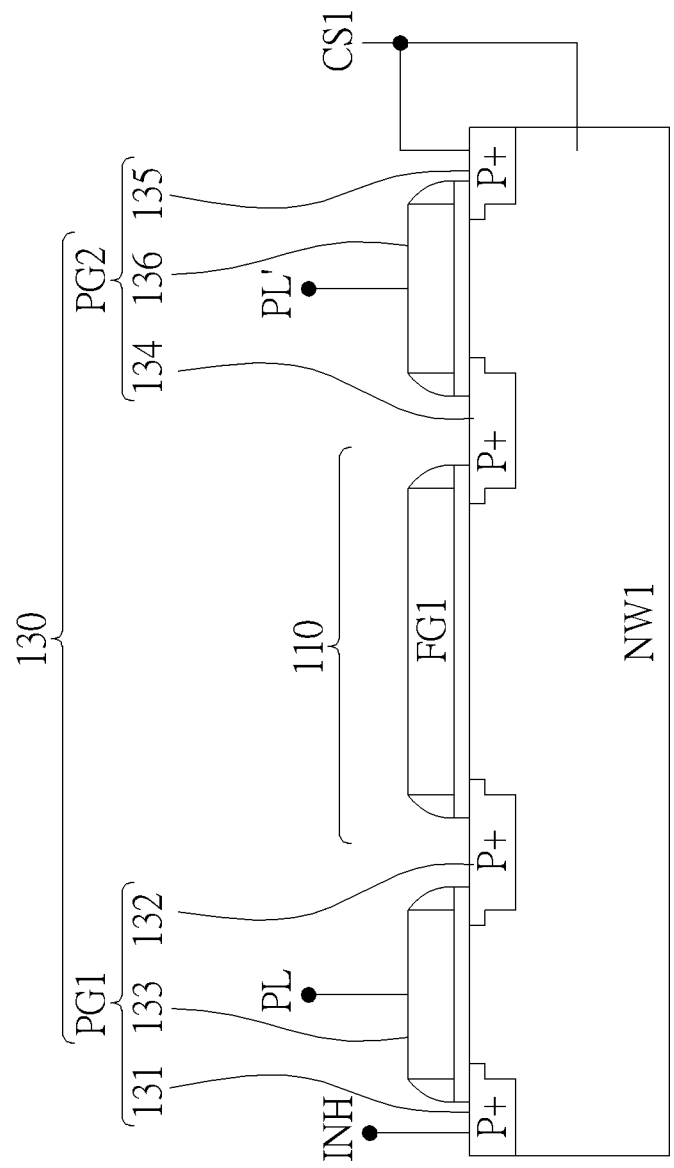
FIG. 3 shows the structure of the first capacitance element and the first voltage passing device in FIG. 2.

FIG. 3 further shows the structure of the first capacitance element 110 and the first voltage passing device 130 shown in FIG. 2. In FIG. 3 the first capacitance element 110 can have a first terminal, a second terminal, a control terminal, and a body. The first terminal and the second terminal of the first capacitance element 110 are coupled to the first voltage passing device 130, and the control terminal of the first capacitance element 110 is coupled to the floating gate FG1 of the first floating gate transistor FGT1. The body of the first capacitance element 110 is part of the first N-well NW1 and can receive the first control signal CS1.

The first voltage passing device 130 includes a first passing gate transistor PG1 and a second passing gate transistor PG2. The first passing gate transistor PG1 has a first terminal 131, a second terminal 132, and a control terminal 133. The first terminal 131 and the second terminal 132 of the first passing gate transistor PG1 are P-type doped regions, and the control terminal 133 of the first passing gate transistor PG1 is a gate structure. The first terminal 131 of the first passing gate transistor PG1 can receive an inhibit signal INH, the second terminal 132 of the first passing gate transistor PG1 is coupled to the first terminal of the first capacitance element 110, and the control terminal 133 of the first passing gate transistor PG1 can receive a first passing gate control signal PL.

The second passing gate transistor PG2 has a first terminal 134, a second terminal 135, and a control terminal 136. The first terminal 134 and the second terminal 135 of the second passing gate transistor PG2 are P-type doped regions, and the control terminal 136 of the second passing gate transistor PG2 is a gate structure. The first terminal 134 of the second passing gate transistor PG2 is coupled to the second terminal of the first capacitance element 110, the second terminal 135 of the second passing gate transistor PG2 can receive the first voltage VPP or the first control signal CS1, and the control terminal 136 of the second passing gate transistor PG2 can receive a second passing gate control signal PL'.

By controlling the first passing gate transistor PG1 and the second passing gate transistor PG2, the first capacitance element 110 can receive different voltages during different operations and the capacitance of the first capacitance element 110 can be adjusted, which may further help to inhibit the first memory cell 100 from being programmed or erased.

Table 1 shows voltages of the signals used for different operations of the first memory cell 100 according to one embodiment of the present invention.

TABLE 1

| Operation | CS1 | CS2 | INH | WL | BL | PL | PL' |
|---|---|---|---|---|---|---|---|
| Program | VPP | VPP | VZ | GND to VDD | GND to VDD | VPP | VX |
| Program Inhibit | VPP | VPP | VZ | GND to VDD | GND to VDD | VX | VPP |
| Erase | GND | VPP | GND | VDD | GND | GND | GND |
| Read | GND | GND | GND | VDD | VDD | GND | GND |

The third voltage GND is smaller than a fourth voltage VDD, the fourth voltage VDD is smaller than a fifth voltage VX, the fifth voltage VX is smaller than the second voltage VZ, and the second voltage VZ is smaller than the first voltage VPP. For example, the third voltage GND can be ground voltage at 0V, the second voltage VZ can be 4V, the first voltage VPP can be 10V, the fourth voltage VDD can be 0.5 to 1.2V, and the fifth voltage VX can be at 3V.

In Table 1, the first capacitance element 110 is mainly used for the program operation, and the second capacitance element 120 is mainly used for the erase operation. During the program operation of the memory unit 10, the first control signal CS1 is at the first voltage VPP, the second control signal CS2 is at the first voltage VPP, the first bit line signal BL is in a range from a fourth voltage VDD to the third voltage GND, the word line signal WL is in a range from the fourth voltage VDD to the third voltage GND, the inhibit signal INH is at the second voltage VZ, the first passing gate control signal PL is at the first voltage VPP, and the second passing gate control signal PL' is at the fifth voltage VX.

In other words, during the program operation of the first memory cell 100, the first passing gate transistor PG1 is turned off and the second passing gate transistor PG2 is turned on. Therefore, both the first control signal CS1 and the voltage outputted by the first voltage passing device 130 received by the first capacitance element 110 are at the first voltage VPP. The floating gate FG1 can be coupled to a voltage high enough to induce the FN electron tunneling injection. Thus, the first memory cell 100 can be programmed.

During the program inhibit operation of the first memory cell 100, the first control signal CS1 is at the first voltage VPP, the second control signal CS2 is at the first voltage VPP, the first bit line signal BL is in a range from the fourth voltage VDD to the third voltage GND, the first word line signal WL is in a range from the fourth voltage VDD to the third voltage GND, the inhibit signal INH is at the second voltage VZ, the first passing gate control signal PL is at the fifth voltage VX, and the second passing gate control signal PL' is at the first voltage VPP.

That is, during the program inhibit operation of the memory unit 10, the first passing gate transistor PG1 is turned on and the second passing gate transistor PG2 is turned off. Therefore, the first capacitance element 110 not only receives the first control signal CS1, which is at the first voltage VPP, but also receives the voltage outputted from the first voltage passing device 130, which is at the second voltage VZ. Since the second voltage VZ is smaller than the first voltage VPP, the floating gate FG1 will not be coupled to a voltage high enough to induce the FN electron tunneling injection. Thus, the first memory cell 100 is inhibited from being programmed.

Consequently, the first passing gate control signal PL and the second passing gate control signal PL' can control the first passing gate transistor PG1 and the second passing gate transistor PG2 to achieve the program operation and the program inhibit operation of the first memory cell 100. Since the inhibit operation can be achieved by the first voltage passing device 130, the first word line transistor WLT1 will not receive any high voltages. That is, the first word line transistor WLT1 can be operated with lower voltages and can have a low threshold voltage. For example, the word line transistor used in prior art may have a threshold voltage around 0.7V, but the threshold voltage of the first word line transistor WLT1 may be 0.3V to 0.4V. In some embodiments of the present invention, the first word line transistor WLT1 can be produced by, adjusting the thickness of gate oxide, using native device, or well implanting. Consequently, the reading process of the memory cell can be achieved with low voltages such as the third voltage GND and the fourth voltage VDD as shown in Table 1. The low voltage operation can help to speed up the reading process and reduce the power consumption.

In some embodiments of the present invention, all memory cells in a memory unit may be erased in the beginning so that the statuses of the memory cells can be controlled by the program operation and the program inhibit operation. In this case, the erase operation can be used as a reset operation. That is, every time before memory cells are being programmed, the memory units will all be erased first. Therefore, no erase inhibit operation is required for such kind of memory units.

However, in some other embodiments of the present invention, all memory cells in a memory unit can be programmed in the beginning. The statuses of the memory cells can be controlled by the erase operation and the erase inhibit operation. In this case, the program operation can be used as a reset operation. Table 2 shows voltages of the signals used for different operations of the first memory cell 100 according to another embodiment of the present invention. In Table 2, the first capacitance element 110 is mainly used for the erase operation, and the second capacitance element 120 is mainly used for the program operation.

TABLE 2

| Operation | CS1 | CS2 | INH | WL | BL | PL | PL' |
|---|---|---|---|---|---|---|---|
| Erase | VPP | GND | VZ | GND to VDD | GND to VDD | VPP | VX |
| Erase Inhibit | VPP | GND | VZ | GND to VDD | GND to VDD | VX | VPP |
| Program | VPP | VPP | VPP | VDD | GND | GND | GND |
| Read | GND | GND | GND | VDD | VDD | GND | GND |

In Table 2, during the erase operation of the first memory cell 100, the first control signal CS1 is at the first voltage VPP, the second control signal CS2 is at the third voltage GND, the first bit line signal BL is in a range from the fourth voltage VDD to the third voltage GND, the word line signal WL is in a range from the fourth voltage VDD to the third voltage GND, the inhibit signal INH is at the second voltage VZ, the first passing gate control signal PL is at the first voltage VPP, and the second passing gate control signal PL' is at a fifth voltage VX.

In other words, during the erase operation of the first memory cell 100, the first passing gate transistor PG1 is turned off and the second passing gate transistor PG2 is turned on. Therefore, both the first control signal CS1 and the voltage outputted by the first voltage passing device 130 are both at the first voltage VPP. Since the second capacitance element 120 is coupled to third voltage GND, the voltage difference between the first capacitance element 110 and the second capacitance element 120 can cause the FN electron tunneling ejection. Thus, the first memory cell 100 can be erased.

During the erase inhibit operation of the first memory cell 100, the first control signal CS1 is at the first voltage VPP, the second control signal CS2 is at the third voltage GND, the first bit line signal BL is in a range from the fourth voltage VDD to the third voltage GND, the word line signal WL is in a range from the fourth voltage VDD to the third voltage GND, the inhibit signal INH is at the second voltage VZ, the first passing gate control signal PL is at the fifth voltage VX, and the second passing gate control signal PL' is at the first voltage VPP.

That is, during the erase inhibit operation of the first memory cell 100, the first passing gate transistor PG1 is turned on and the second passing gate transistor PG2 is turned off. Therefore, the first capacitance element 110 does not only receive the first control signal CS1, which is at the first voltage VPP, but also receives the voltage outputted from the first voltage passing device 130, which is at the second voltage VZ. Since the second voltage VZ is smaller than the first voltage VPP, the voltage difference between the first capacitance element 110 and the second capacitance element 120 is not high enough to induce the FN electron tunneling ejection. Thus, the first memory cell 100 is inhibited from being erased.

Consequently, the first passing gate control signal PL and the second passing gate control signal PL' can control the first passing gate transistor PG1 and the second passing gate transistor PG2 to achieve the erase operation and the erase inhibit operation of the first memory cell 100. Since the inhibit operation can be achieved by the first voltage passing device 130, the first word line transistor WLT1 will not receive any high voltages. That is, the first word line transistor WLT1 can be operated with lower voltages and can have a low threshold voltage. Therefore, the reading process of the memory unit 10 can be achieved with low voltages such as the third voltage GND and the fourth voltage VDD as shown in Table 2. The low voltage operation can help to speed up the reading process and reduce the power consumption.

Figure 4:
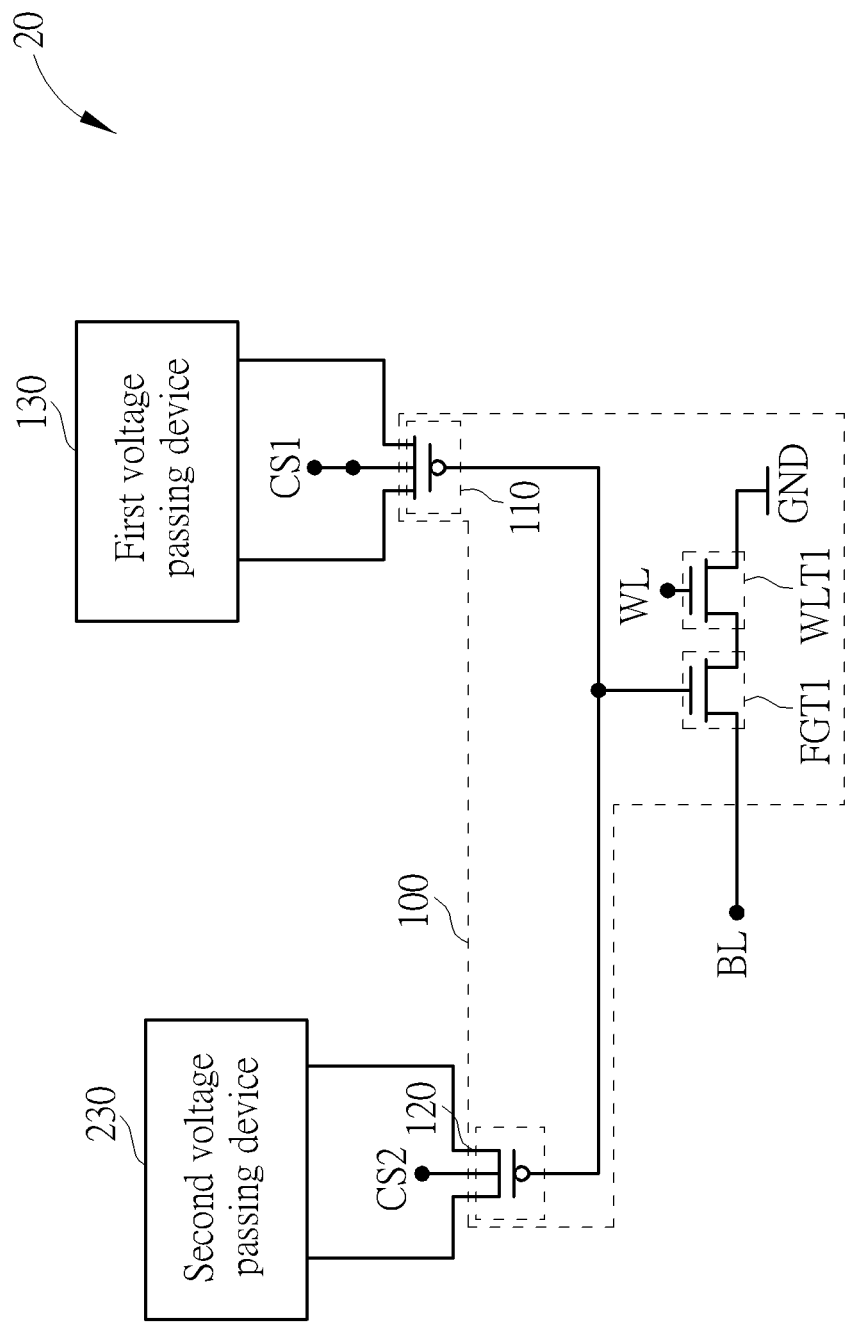
FIG. 4 shows a memory unit according to another embodiment of the present invention.

In some embodiments of the present invention, the memory unit may require both the program inhibit operation and the erase inhibit operation. In this case, the memory unit may include another second voltage passing device coupled to the second capacitance element. FIG. 4 shows a memory unit 20 according to another embodiment of the present invention.

The memory unit 20 has similar structure as the memory unit 10 but further includes a second voltage passing device 230. The second capacitance element 120 of the memory unit 20 can be coupled to the second voltage passing device 230 and receive voltages outputted from the second voltage passing device 230. The second voltage passing device 230 can output the first voltage VPP during the program operation or the erase operation of the memory cell 100 and output the second voltage VZ during the inhibit operation of the memory cell 100. That is, when the first voltage passing device 130 is operated by the control signals shown in Table 1 for the program inhibit operation, the second voltage passing device 230 can be operated by the control signals shown in Table 2 for the erase inhibit operation. In this case, the memory unit 20 can achieve the program inhibit operation with the first voltage passing device 130 and achieve the erase inhibit operation with the second voltage passing device 230. Meanwhile, the first word line transistor WLT1 can still be operated with lower voltages so that the time and power consumption required by the reading process of the memory unit 20 can both be reduced.

Figure 5:
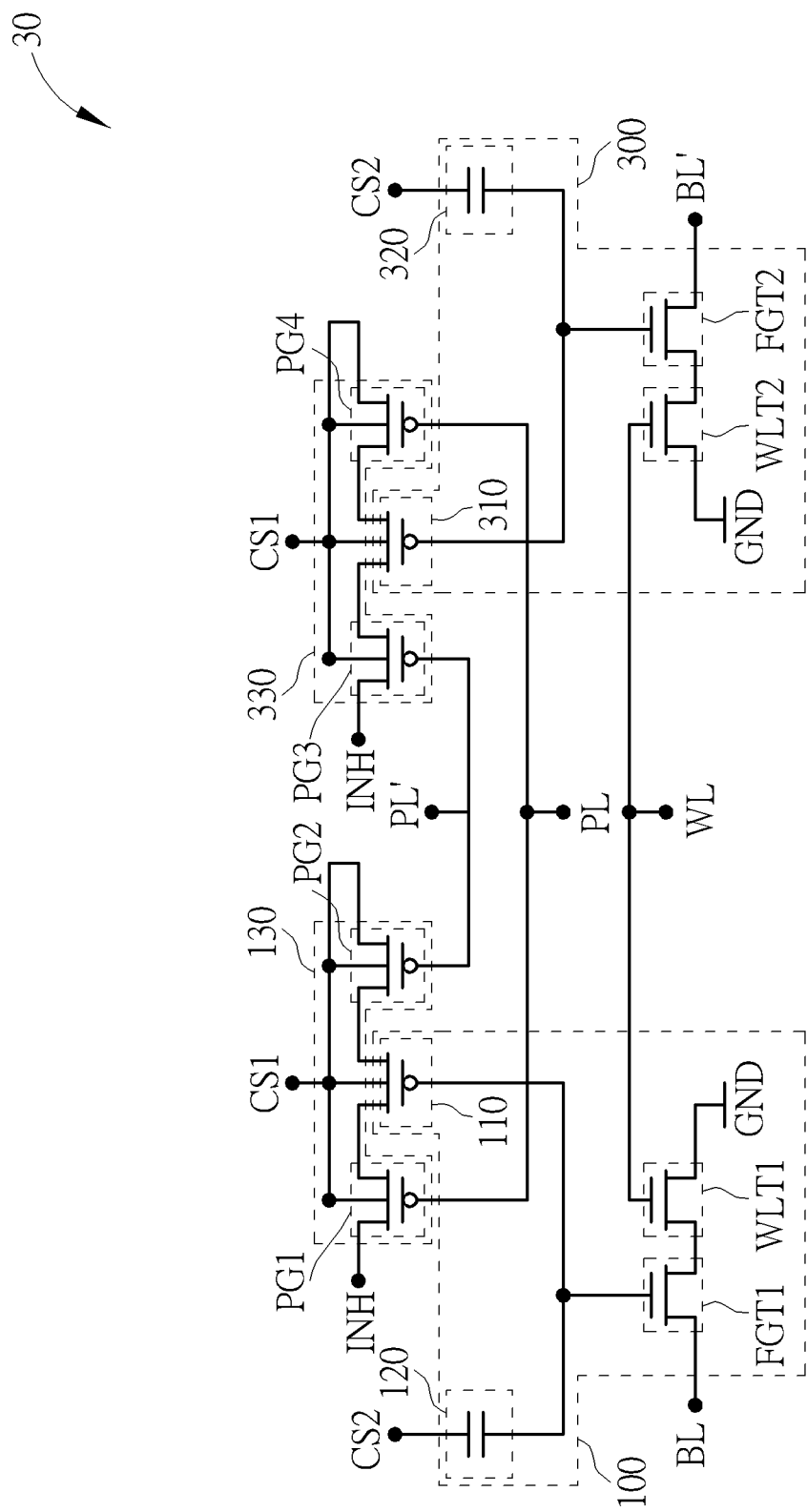
FIG. 5 shows a memory unit according to another embodiment of the present invention.

FIG. 5 shows a memory unit 30 according to another embodiment of the present invention. The memory unit 30 includes the first memory cell 100, a second memory cell 300, a first voltage passing device 130, and a second voltage passing device 330. The second memory cell 300 has a similar structure as the first memory cell 100, but has different signal connections. The second memory cell 300 includes the second floating gate transistor FGT2, the second word line transistor WLT2, the third capacitance element 310, and the fourth capacitance element 320.

The second voltage passing device 330 includes a third passing gate transistor PG3 and a fourth passing gate transistor PG4. The third passing gate transistor PG3 has a first terminal, a second terminal, and a control terminal. The first terminal of the third passing gate transistor PG3 can receive the inhibit signal INH, the control terminal of the third passing gate transistor PG3 can receive the second passing gate control signal PL'.

The fourth passing gate transistor PG4 has a first terminal, a second terminal, and a control terminal. The second terminal of the fourth passing gate transistor PG4 can receive the first voltage VPP or the first control signal CS1, and the control terminal of the fourth passing gate transistor PG4 can receive the first passing gate control signal PL.

The third capacitance element 310 is coupled to the second terminal of the third passing gate transistor PG3 and the first terminal of the fourth passing gate transistor PG4. The third capacitance element 310 can receive the first control signal CS1 and voltages outputted from the second voltage passing device 330. The fourth capacitance element 320 can receive the second control signal CS2.

Furthermore, the second floating gate transistor FGT2 has a first terminal, a second terminal, and a floating gate FG2. The first terminal of the second floating gate transistor FGT2 can receive a second bit line signal BL', and the floating gate FG2 of the second floating gate transistor FGT2 is coupled to the third capacitance element 310 and the fourth capacitance element 320. The second word line transistor WLT2 has a first terminal, a second terminal, and a control terminal. The first terminal of the second word line transistor WLT2 is coupled to the second terminal of the second floating gate transistor FGT2, the second terminal of the second word line transistor WLT2 can receive the third voltage GND, and the control terminal of the second word line transistor WLT2 can receive the word line signal WL.

In some embodiments of the present invention, the first passing gate control signal PL and the second passing gate control signal PL' are complementary to each other. Since the first passing gate transistor PG1 receives the first passing gate control signal PL and the third passing gate transistor PG3 receives the second passing gate control signal PL', the first passing gate transistor PG1 and the third passing gate transistor PG3 will perform different operations. For example, when the first passing gate transistor PG1 is turned on, the third passing gate transistor PG3 would be turned off. Also, when the first passing gate transistor PG1 is turned off, the third passing gate transistor PG3 would be turned on. Similarly, since the second passing gate transistor PG2 and the fourth passing gate transistor PG4 receive different passing gate control signals PL' and PL, they will be turned on or turned off in different time points. In other words, while the floating gate FG1 of the first floating gate transistor FGT1 is programmed with the aids of the second passing gate transistor PG2, the floating gate FG2 of the second floating gate transistor FGT2 is inhibited from being programmed with the aids of the third passing gate transistor PG3. Also, while the floating gate FG1 of the first floating gate transistor FGT1 is inhibited from being programmed with the aids of the first passing gate transistor PG1, the floating gate FG2 of the second floating gate transistor FGT2 is programmed with the aids of the fourth passing gate transistor PG4.

That is, after a program operation of the memory unit 30, the first memory cell 100 and the second memory cell 300 will be at different statuses. Thus, memory unit 30 can output differential signals according to system requirements.

In addition, since the high voltage VPP can be controlled by the passing gate transistors, a high voltage driver for providing the first voltage VPP can be shared by first voltage passing device 130 and the second voltage passing device 330, which further simplifies the design of the memory units. Namely, in some embodiments of the present invention, the first voltage passing device 130 and the second voltage passing device 330 can be coupled to a same high voltage driver to receive the first voltage VPP generated by the high voltage driver.

Figure 6:
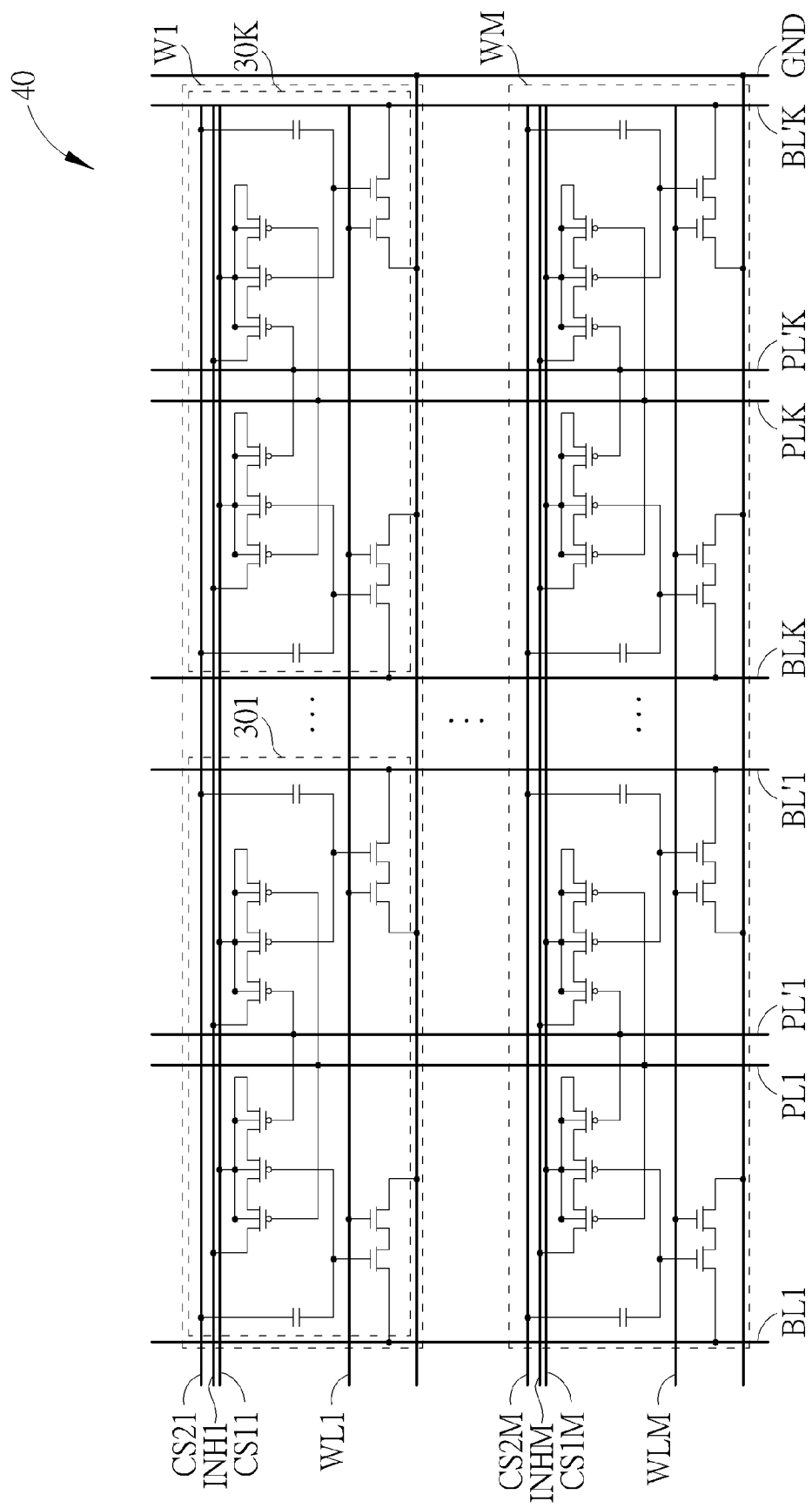
FIG. 6 shows a memory array according one embodiment of the present invention.

FIG. 6 shows a memory array 40 according one embodiment of the present invention. The memory array 40 includes M words W1 to WM. Each word W1 to WM has K memory units 301 to 30K. Each memory unit may have the same structure as the memory cell 30 as shown in FIG. 5. The M words W1 to WM receive different first control signals CS11 to CS1M, different second control signals CS21 to CS2M, different inhibit control signals INH1 to INHM, and different word line signals WL1 to WLM. Therefore, the M words W1 to WM can be operated independently.

Also, the memory units 301 to 30K in the same word, ex. in the word W1, receive different bit line signals BL1 to BLK and BL'1 to BL'K, different passing gate control signals PL1 to PLK and PL'1 to PL'K. Therefore, the memory units 301 to 30K can also be operated independently.

Figure 7:
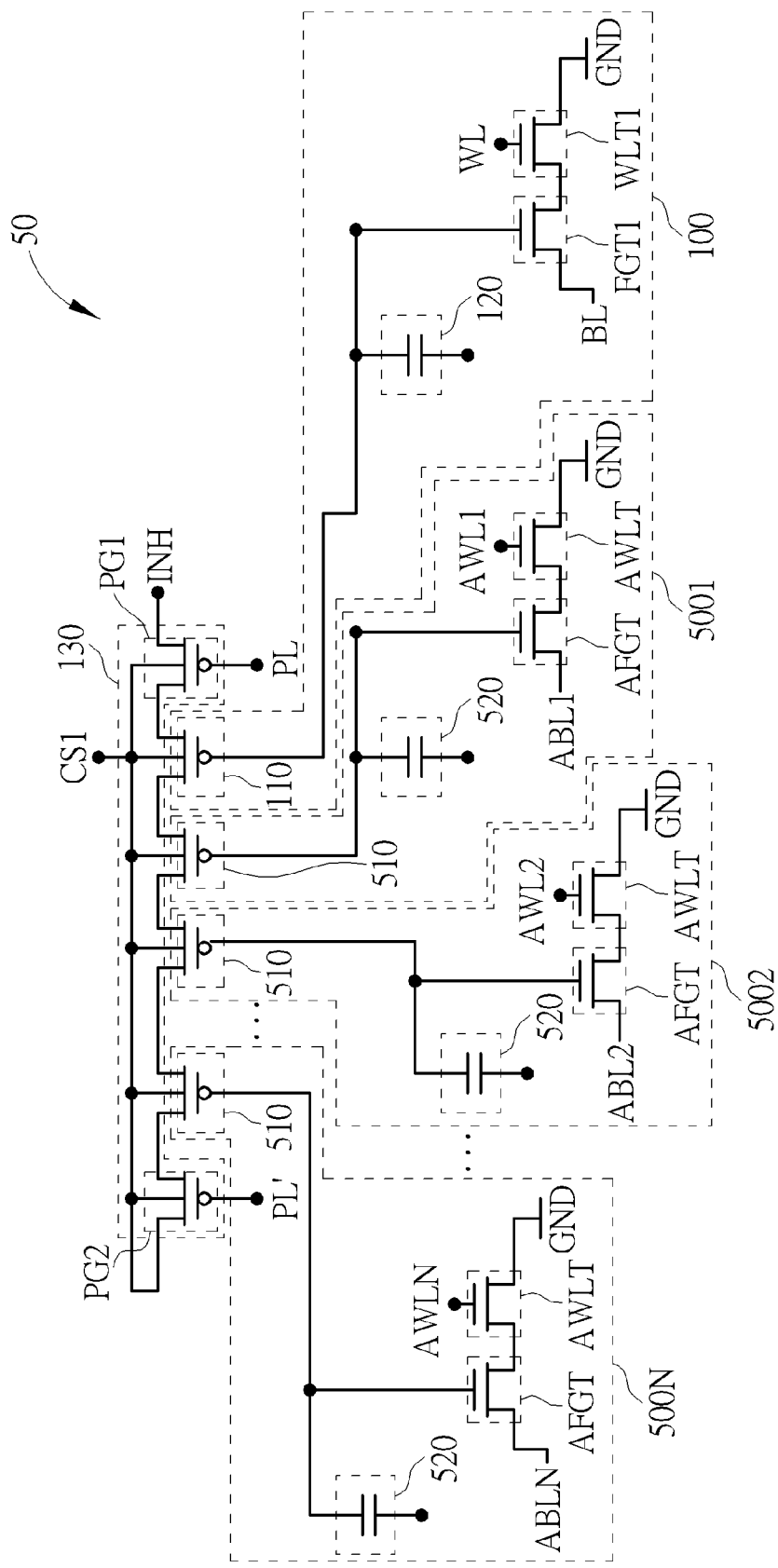
FIG. 7 shows a memory unit according to another embodiment of the present invention.

FIG. 7 shows a memory unit 50 according to one embodiment of the present invention. The memory units 50 and 10 have similar structures; however, the memory unit 50 further includes N additional memory cells 5001 to 500N. The N additional memory cells 5001 to 500N and the first memory cell 100 have similar structure. Each additional memory cell 5001 to 500N includes an additional first capacitance element 510, an additional second capacitance element 520, an additional floating gate transistor AFGT, and an additional word line transistor AWLT. N is a positive integer. In some embodiments of the present invention, the N additional capacitance elements 510 of the N additional memory cells 5001 to 500N, the first capacitance element 110, and the first voltage passing device 130 are disposed in the same N-well.

The N additional first capacitance elements 510 of the N additional memory cells 5001 to 500N and the first capacitance element 110 have the same structure and are disposed in the same N-well. The N additional first capacitance elements 510 of the N additional memory cells 5001 to 500N are coupled in series between the second terminal of the first capacitance element 110 and the first terminal of the second passing gate transistor PG2. In other words, a first terminal of the additional first capacitance element 510 of the additional memory cell 5001 is coupled to the second terminal of the first capacitance element 110, a first terminal of the additional first capacitance element 510 of the additional memory cell 5002 is coupled to a second terminal of the additional first capacitance element 510 of the additional memory cell 5001, and so on. Finally, a second terminal of the additional first capacitance element 510 of the additional memory cell 500N is coupled to the first terminal of the second passing gate transistor PG2. The additional floating gate transistor AFGT has a first terminal, a second terminal, and a floating gate. The first terminal of each of the additional floating gate transistor AFGT receives a corresponding bit line signal of the bit line signal ABL1 to ABLN, and the floating gate of the additional floating gate transistor AFGT is coupled to the additional first capacitance element 510 and the additional second capacitance element 520.

The additional word line transistor AWLT has a first terminal, a second terminal, and a control terminal. The first terminal of the additional word line transistor AWLT is coupled to the second terminal of the additional floating gate transistor AFGT, the second terminal of the additional word line transistor AWLT receives the third voltage GND, and the control terminal of the additional word line transistor AWLT receives a corresponding word line signal of the word line signals AWL1 to AWLN.

Since the voltage can be passed through the N-well among the additional first capacitance elements 510 and the first capacitance element 110, different memory cells can share the same voltage passing device to further reduce the circuit area. For example, in FIG. 7, when the first passing gate transistor PG1 is turned on, the additional first capacitance elements 510 of the N additional memory cells 5001 to 500N can all receive the inhibit signal INH, which is at the second voltage VZ. Also, when the second passing gate transistor PG2 is turned on, the additional first capacitance elements 510 of the N additional memory cells 5001 to 500N can all receive the first control signal CS1 (or the first voltage VPP) through the second passing gate transistor PG2.

In some embodiments of the present invention, the N additional floating gate transistors AFGT of the N additional memory cells 5001 to 500N can be controlled by different bit line signals ABL1 to ABLN, and the N additional word line transistors AWLT of the N additional memory cells 5001 to 500N can be controlled by different word line signals AWL1 to AWLN. However, in some embodiments of the present invention, the additional floating gate transistors AFGT of the N additional memory cells 5001 to 500N can receive the same bit line signal. Also, the additional word line transistors AWLT of the N additional memory cells 5001 to 500N can receive the same word line signal. In this case, the additional floating gate transistors AFGT of the N additional memory cells 5001 to 500N and the first floating gate transistor FGT1 can be operated simultaneously and consistently, that is, to be programmed or erased in the same time.

Figure 8:
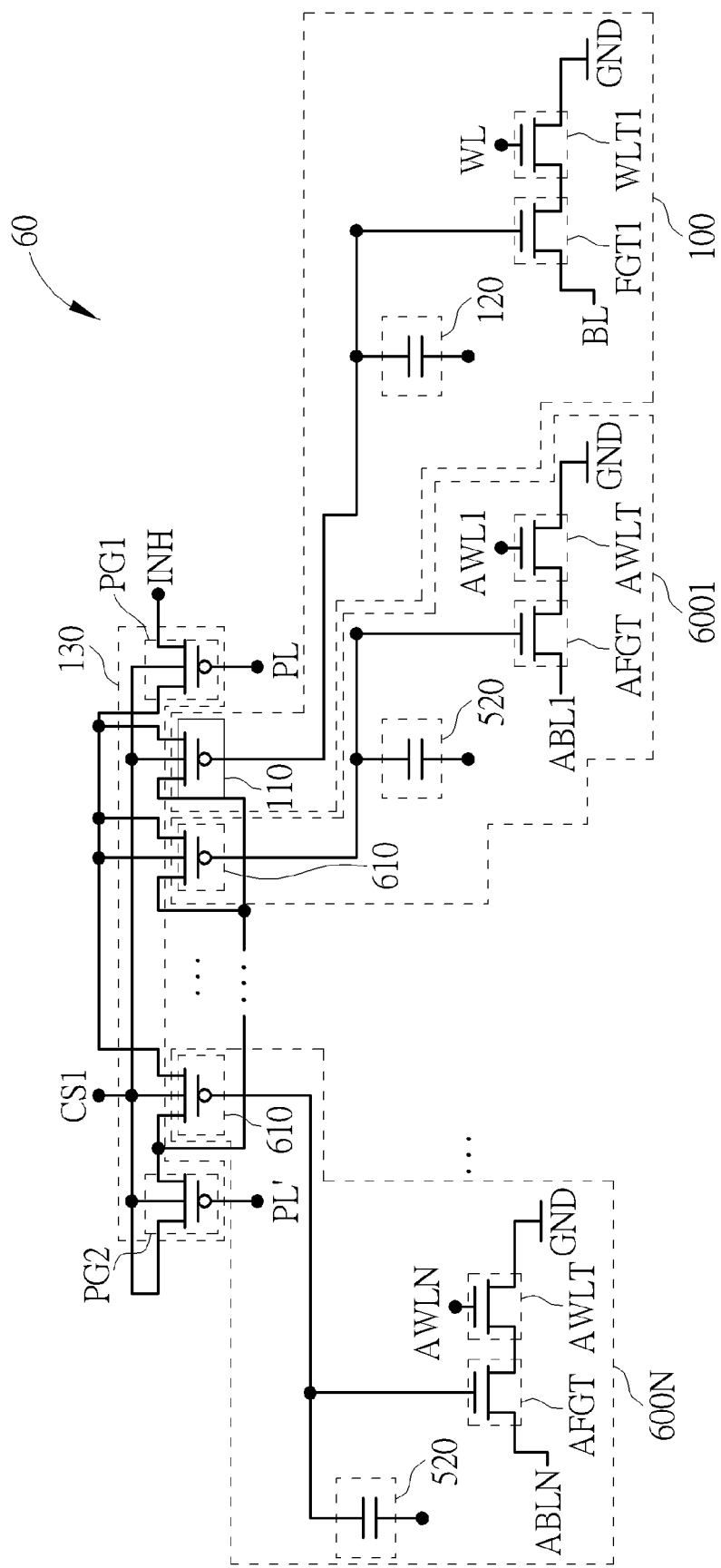
FIG. 8 shows a memory unit according to another embodiment of the present invention.

FIG. 8 shows a memory unit 60 according to one embodiment of the present invention. The memory units 60 and 50 have similar structures. The memory unit 60 has N additional memory cells 6001 to 600N instead of the N additional memory cells 5001 to 500N. The additional memory cells 6001 to 600N and the additional memory cells 5001 to 500N have similar structures but different connection.

The additional first capacitance element 610 of the additional memory cells 6001 to 600N and the first capacitance element 110 have the same structure and are disposed in the same N-well. The additional first capacitance element 610 of each of the additional memory cells 6001 to 600N has a first terminal coupled to the first terminal of the first capacitance element 110, a second terminal coupled to the first terminal of the second passing gate transistor PG2, and a control terminal coupled to the floating gate of the corresponding additional floating gate transistor AFGT.

In FIG. 8, when the first passing gate transistor PG1 is turned on, all the additional first capacitance elements 610 of the additional memory cells 6001 to 600N can receive the inhibit signal INH. Also, when the second passing gate transistor PG2 is turned on, all the additional first capacitance elements 610 of the additional memory cells 6001 to 600N can receive the first control signal (or the first voltage VPP). In this case, different memory cells can share the same voltage passing device to further reduce the circuit area.

In addition, the memory units 50 and 60 may further include a high voltage driver to provide the first voltage VPP for the entire memory units 50 and 60, which further simplifies the design of the memory units.

Figure 9:
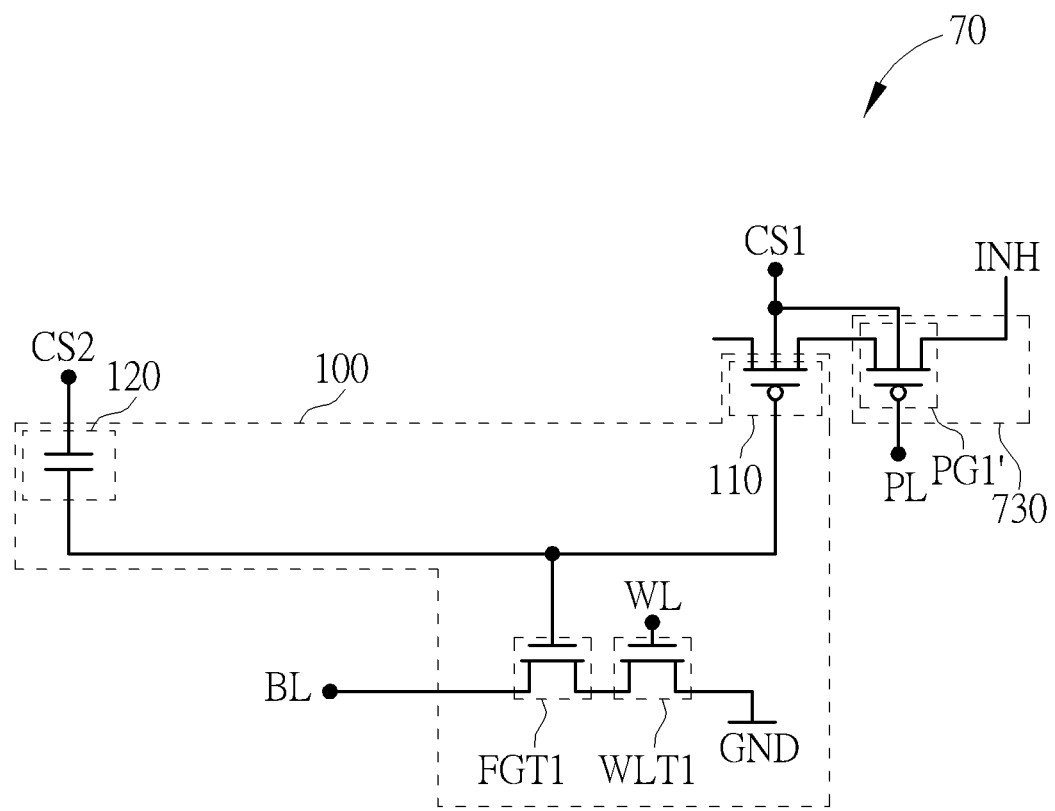
FIG. 9 shows a memory unit according to another embodiment of the present invention.
Figure 10:
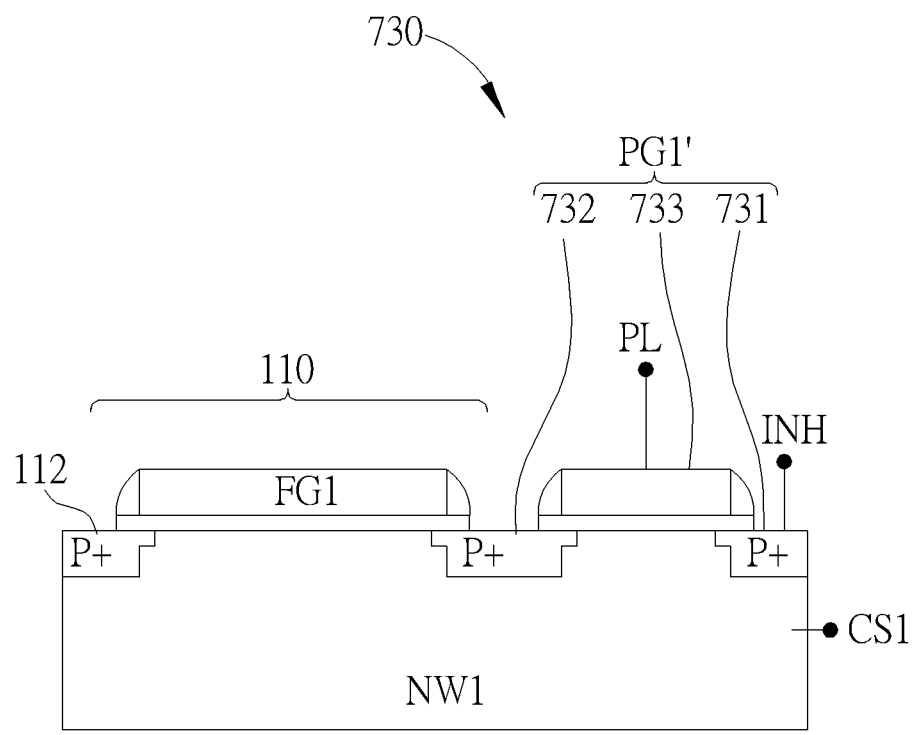
FIG. 10 shows the structure of the first capacitance element and the first voltage passing device in FIG. 9.

FIG. 9 shows a memory unit 70 according to one embodiment of the present invention. The memory unit 70 includes the memory cell 100 and a first voltage passing device 730. FIG. 10 shows the structure of the first capacitance element 110 and the first voltage passing device 730.

In FIG. 10, the first voltage passing device 730 includes a first passing gate transistor PG1'. The first passing gate transistor PG1' has a first terminal 731, a second terminal 732, and a control terminal 733. The first terminal 731 and the second terminal 732 of the first passing gate transistor PG1' are P-type doped regions, and the control terminal 733 of the first passing gate transistor PG1' is a gate structure. The first terminal 731 of the first passing gate transistor PG1' can receive an inhibit signal INH, the second terminal 732 of the first passing gate transistor PG1' is coupled to the first terminal of the first capacitance element 110, and the control terminal 733 of the first passing gate transistor PG1' can receive a first passing gate control signal PL.

In this embodiment, the first terminal of the first capacitance element 110 is coupled to the first voltage passing device 730, and the control terminal of the first capacitance element 110 is coupled to the floating gate FG1 of the first floating gate transistor FGT1. The body of the first capacitance element 110 is part of the first N-well NW1 and can receive the first control signal CS1. Furthermore, in FIG. 10, the second terminal 112 of the first capacitance element 110 is a floating P-type doped region. However, in some embodiments of the present invention, the second terminal 112 of the first capacitance element 110 can also be implemented by a shallow trench isolation region.

Table 3 shows voltages of the signals used for different operations of the memory unit 70 according to one embodiment of the present invention.

TABLE 3

| Operation | CS1 | CS2 | INH | WL | BL | PL |
|---|---|---|---|---|---|---|
| Program | VPP | VPP | VPP | GND to VDD | GND to VDD | VX |
| Program Inhibit | VPP | VPP | VZ | GND to VDD | GND to VDD | VX |
| Erase | GND | VPP | GND | VDD | GND | GND |
| Read | GND | GND | GND | VDD | VDD | GND |

In Table 3, the first capacitance element 110 is mainly used for the program operation, and the second capacitance element 120 is mainly used for the erase operation. During the program operation of the memory cell 100, the first control signal CS1 is at the first voltage VPP, the second control signal CS2 is at the first voltage VPP, the first bit line signal BL is in a range from a fourth voltage VDD to the third voltage GND, the word line signal WL is in a range from the fourth voltage VDD to the third voltage GND, the inhibit signal INH is at the first voltage VPP, and the first passing gate control signal PL is at the fifth voltage VX.

In other words, during the program operation of the memory cell 100 of the memory unit 70, the first passing gate transistor PG1' is turned on and the inhibit signal INH is at the first voltage VPP. Therefore, the output voltage outputted by the first voltage passing device 730 is at the first voltage VPP, and the floating gate FG1 can be coupled to a voltage high enough to induce the FN electron tunneling injection. Thus, the memory cell 100 of the memory unit 70 can be programmed.

During the program inhibit operation of the memory cell 100 of the memory unit 70, the first control signal CS1 is at the first voltage VPP, the second control signal CS2 is at the first voltage VPP, the first bit line signal BL is in a range from the fourth voltage VDD to the third voltage GND, the word line signal WL is in a range from the fourth voltage VDD to the third voltage GND, the inhibit signal INH is at the second voltage VZ, and the first passing gate control signal PL is at the fifth voltage VX.

That is, during the program inhibit operation of the memory cell 100 of the memory unit 70, the first passing gate transistor PG1' is turned on, and the inhibit signal INH is at the second voltage VZ. Therefore, the output voltage outputted by the first voltage passing device 730 is at the second voltage VZ. In this case, the first capacitance element 110 not only receives the first control signal CS1, which is at the first voltage VPP, but also receives the second voltage VZ voltage outputted from the first voltage passing device 730. Since the second voltage VZ is smaller than the first voltage VPP, the floating gate FG1 will not be coupled to a voltage high enough to induce the FN electron tunneling injection. Thus, the memory cell 100 of the memory unit 70 is inhibited from being programmed.

Consequently, the first passing gate control signal PL and the inhabitation signal INH can control the first passing gate transistor PG1' to achieve the program operation and the program inhibit operation of the memory unit 70. Since the inhibit operation can be achieved by the first voltage passing device 730, the first word line transistor WLT1 will not receive any high voltages. That is, the first word line transistor WLT1 can be operated with lower voltages and can have a low threshold voltage. Therefore, the reading process of the memory unit can be achieved with low voltages such as the third voltage GND and the fourth voltage VDD as shown in Table 3. The low voltage operation can help to speed up the reading process and reduce the power consumption.

Table 4 shows voltages of the signals used for different operations of the memory unit 70 according to another embodiment of the present invention. In Table 4, the first capacitance element 110 is mainly used for the erase operation, and the second capacitance element 120 is mainly used for the program operation.

TABLE 4

| Operation | CS1 | CS2 | INH | WL | BL | PL |
|---|---|---|---|---|---|---|
| Erase | VPP | GND | VPP | GND to VDD | GND to VDD | VX |
| Erase Inhibit | VPP | GND | VZ | GND to VDD | GND to VDD | VX |
| Program | VPP | VPP | VPP | VDD | GND | GND |
| Read | GND | GND | GND | VDD | VDD | GND |

In Table 4, during the erase operation of the memory cell 100 in the memory unit 70, the first control signal CS1 is at the first voltage VPP, the second control signal CS2 is at the third voltage GND, the first bit line signal BL is in a range from the fourth voltage VDD to the third voltage GND, the word line signal WL is in a range from the fourth voltage VDD to the third voltage GND, the inhibit signal INH is at the first voltage VPP, and the first passing gate control signal PL is at the fifth voltage VX.

In other words, during the erase operation of the memory cell 100 in the memory unit 70, the first passing gate transistor PG1' is turned on and the inhibit signal INH is at the first voltage VPP. Therefore, both the first control signal CS1 and the voltage outputted by the first voltage passing device 730 are both at the first voltage VPP. Since the second capacitance element 120 is coupled to third voltage GND, the voltage difference between the first capacitance element 110 and the second capacitance element 120 can cause the FN electron tunneling ejection. Thus, the memory cell 100 in the memory unit 70 can be erased.

During the erase inhibit operation of the memory cell 100 in the memory unit 70, the first control signal CS1 is at the first voltage VPP, the second control signal CS2 is at the third voltage GND, the first bit line signal BL is in a range from the fourth voltage VDD to the third voltage GND, the word line signal WL is in a range from the fourth voltage VDD to the third voltage GND, the inhibit signal INH is at the second voltage VZ, and the first passing gate control signal PL is at the fifth voltage VX.

That is, during the erase inhibit operation of the memory cell 100 in the memory unit 70, the first passing gate transistor PG1' is turned on and the inhibit signal INH is at the second voltage VZ. Therefore, first capacitance element 110 not only receives the first control signal CS1, which is at the first voltage VPP, but also receives the voltage outputted from the first voltage passing device 730, which is at the second voltage VZ. Since the second voltage VZ is smaller than the first voltage VPP, the voltage difference between the first capacitance element 110 and the second capacitance element 120 is not high enough to induce the FN electron tunneling ejection. Thus, the memory cell 100 in the memory unit 70 is inhibited from being erased.

Consequently, the first passing gate control signal PL and the inhabitation signal INH can control the first passing gate transistor PG1' to achieve the erase operation and the erase inhibit operation of the memory cell 100 in the memory unit 70. Since the inhibit operation can be achieved by the first voltage passing device 730, the first word line transistor WLT1 will not receive any high voltages. That is, the first word line transistor WLT1 can be operated with lower voltages and can have a low threshold voltage. Therefore, the reading process of the memory unit 70 can be achieved with low voltages such as the third voltage GND and the fourth voltage VDD as shown in Table 4. The low voltage operation can help to speed up the reading process and reduce the power consumption.

In some embodiments of the present invention, the memory unit may require both the program inhibit operation and the erase inhibit operation. In this case, the memory unit may include another second voltage passing device coupled to the second capacitance element, such as the memory unit 20 shown in FIG. 4. Furthermore, in some embodiments of the present invention, both the first voltage passing device 130 and the second voltage passing device 230 in the memory unit 20 can be replaced by voltage passing devices with same structure as the same voltage passing device 730. By applying the signals shown in Table 3 and Table 4, both the program inhibit operation and the erase inhibit operation can be achieved.

Figure 11:
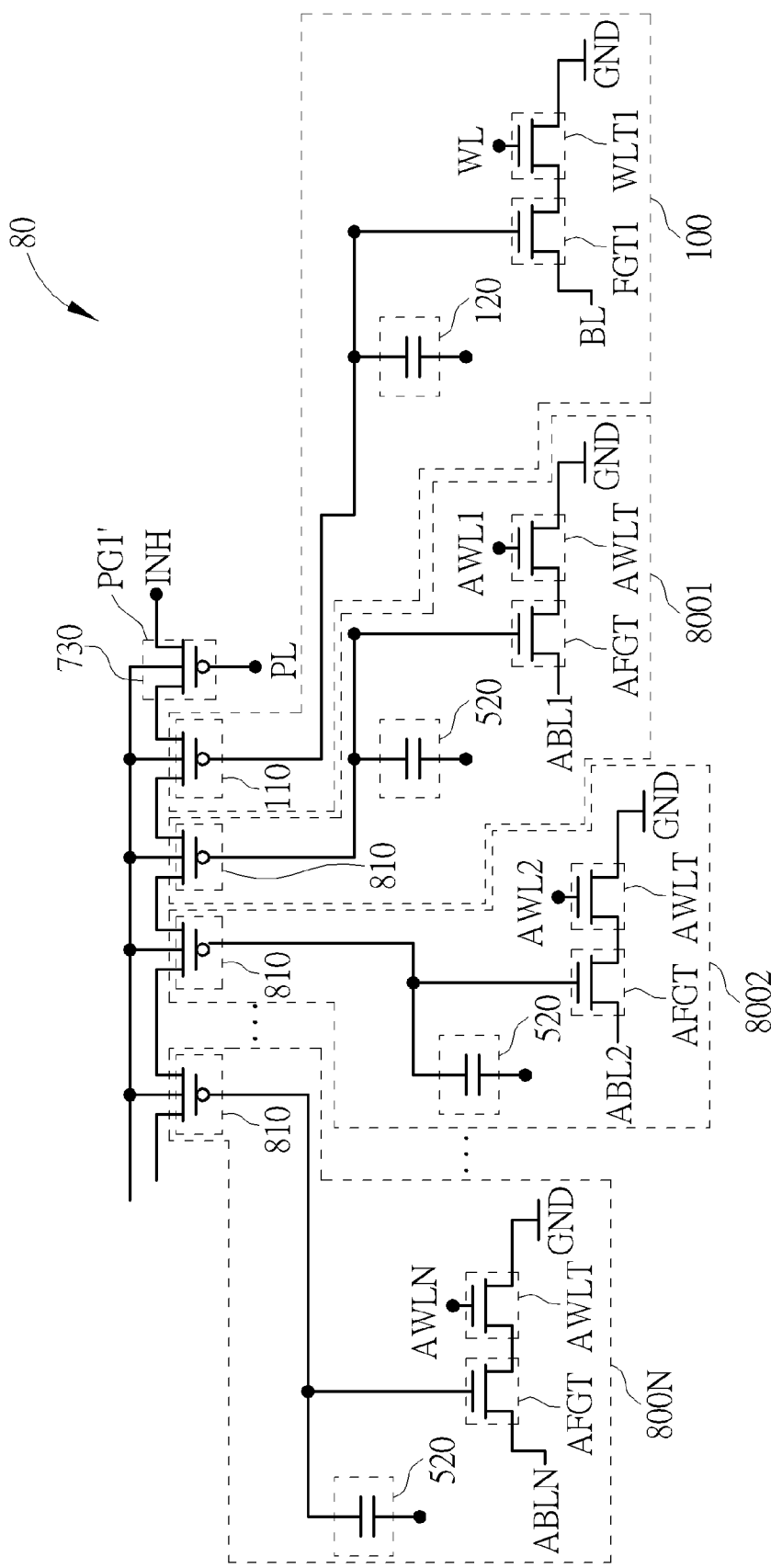
FIG. 11 shows a memory unit according to another embodiment of the present invention.

In addition, FIG. 11 shows a memory unit 80 according to one embodiment of the present invention. The memory units 80 and 70 have similar structures. The memory unit 80 further includes N additional memory cells 8001 to 800N. N is a positive integer. The additional first capacitance elements 810 of the N additional memory cells 8001 to 800N and the first capacitance element 110 have the same structure and are disposed in the same N-well as the first voltage passing device 730.

N additional capacitance elements 810 of the N additional memory cells 8001 to 800N are coupled in series with the first capacitance element 110. In other words, a first terminal of the additional capacitance element 810 of the additional memory cell 8001 is coupled to the second terminal of the first capacitance element 110, a first terminal of the additional capacitance element 810 of the additional memory cell 8002 is coupled to a second terminal of the additional capacitance element 810 of the additional memory cell 8001, and so on. Also, a second terminal of the additional first capacitance element 810 of the additional memory cell 800N can be floating.

In FIG. 11, when the first passing gate transistor PG1' is turned on, all the additional capacitance elements 810 of the N additional memory cells 8001 to 800N can receive the inhabitation signal INH. Since the voltage can be passed through the N-well, different memory cells can share the same voltage passing device 730 to further reduce the circuit area. In some embodiments of the present invention, the N additional floating gate transistors AFGT of the N additional memory cells 8001 to 800N can be controlled by different bit line signals ABL1 to ABLN, and the N additional word line transistors AWLT of the N additional memory cells 8001 to 800N can be controlled by different word line signals AWL1 to AWLN.

However, in some embodiments of the present invention, the additional floating gate transistors AFGT of the N additional memory cells 8001 to 800N and the first floating gate transistor FGT1 can receive the same bit line signal BL. Also, the additional word line transistors AWLT of the N additional memory cells 8001 to 800N and the first word line transistor WLT1 can receive the same word line signal WL. In this case, the additional floating gate transistors AFGT and the first floating gate transistor FGT1 can be operated simultaneously and consistently, that is, to be programmed or erased in the same time.

Figure 12:
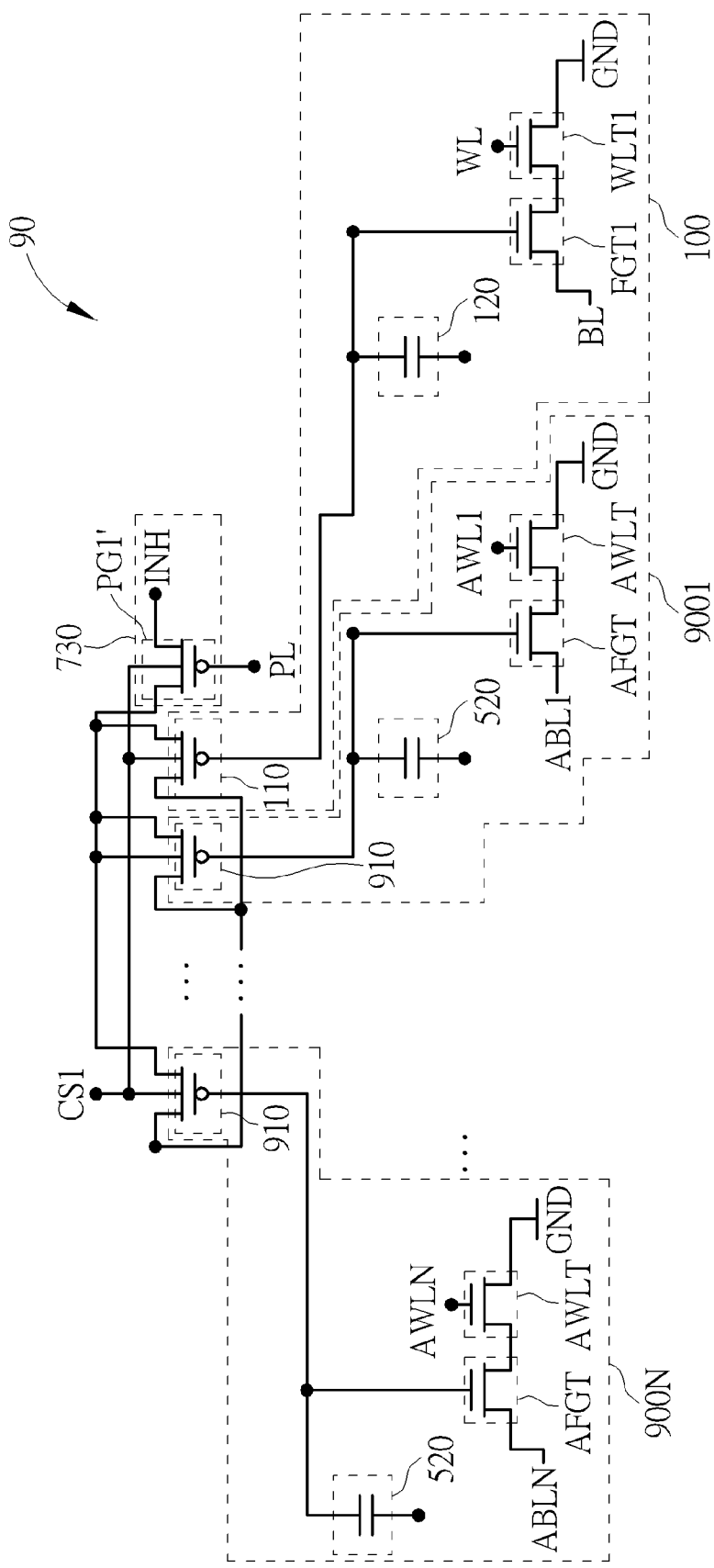
FIG. 12 shows a memory unit according to another embodiment of the present invention.

FIG. 12 shows a memory unit 90 according to one embodiment of the present invention. The memory units 90 and 80 have similar structures. The memory unit 90 includes N additional memory cells 9001 to 900N instead of the N additional capacitance elements 8001 to 800N. The additional first capacitance elements 910 of the N additional memory cells 9001 to 900N and the first capacitance element 110 have the same structure and are disposed in the same N-well as the first voltage passing device 730.

The additional first capacitance element 910 of each of the N additional memory cells 9001 to 900N has a first terminal, a second terminal, and a control terminal. The first terminal of the additional first capacitance element 910 is coupled to the first terminal of the first capacitance element 110, the second terminal of the additional first capacitance element 910 can be coupled to the second terminal of the first capacitance element 110 and be floating, and the control terminal of the additional first capacitance element 910 is coupled to a corresponding additional floating gate transistor AFGT of the N additional memory cells 9001 to 900N.

In FIG. 12, when the first passing gate transistor PG1' is turned on, all the additional first capacitance elements 910 of the N additional memory cells 9001 to 900N can receive the inhabitation signal INH. In this case, different memory cells can share the same voltage passing device to further reduce the circuit area.

In addition, the memory unit of the various embodiments as described above may further include a plurality of select transistors each coupled to a corresponding floating gate transistor for receiving a corresponding bit line signal to allow different bias conditions in the inhibit operation. That is to say, each bit line signal may be received by the corresponding floating gate transistor through a corresponding select transistor.

In summary, the memory unit provided by the embodiments of the present invention can perform the inhabitation operations by voltage passing devices. Therefore, the word line transistor can be operated with lower voltages and can have a low threshold voltage, which helps to speed up the reading process and reduce the power consumption. Furthermore, since the passing gate transistors can be used to control the high voltage, the high voltage source can be shared by the memory units in a same word or capacitance elements in a same memory unit, which further reduce the circuit area of the memory unit.

Those skilled in the art will readily observe that numerous modifications and alterations of the device and method may be made while retaining the teachings of the invention. Accordingly, the above disclosure should be construed as limited only by the metes and

What is claimed is:

1. A memory unit, comprising:
   a first voltage passing device configured to output voltages according to operations of the memory unit, the first voltage passing device comprising a first passing gate transistor having a first terminal configured to receive an inhibit signal, a second terminal, and a control terminal configured to receive a passing gate control signal; and
   a first memory cell comprising:
      a first floating gate transistor having a first terminal configured to receive a first bit line signal, a second terminal, and a floating gate; and
      a first capacitance element having a first terminal coupled to the second terminal of the first passing gate transistor, a second terminal, a control terminal coupled to the floating gate of the first floating gate transistor, and a body configured to receive a first control signal;
   wherein:
   the first capacitance element and the first voltage passing device are disposed in a first N-well;
   the first terminal of the first capacitance element receives a first voltage outputted from the first voltage passing device during a program operation or an erase operation of the first memory cell and receives a second voltage outputted from the first voltage passing device during an inhibit operation of the first memory cell;
   the first voltage is greater than the second voltage;
   during the program operation of the memory unit, the first control signal is at the first voltage, the first bit line signal is in a range from a fourth voltage to a third voltage, the inhibit signal is at the first voltage, the passing gate control signal is at a fifth voltage, and the first terminal of the first passing gate transistor receives the first voltage;
   during a program inhibit operation of the memory unit, the first control signal is at the first voltage, the first bit line signal is in a range from the fourth voltage to the third voltage, the inhibit signal is at the second voltage, the passing gate control signal is at the fifth voltage, and the first terminal of the first passing gate transistor receives the second voltage; and the third voltage is smaller than the fourth voltage, the fourth voltage is smaller than the fifth voltage, and the fifth voltage is smaller than the second voltage.

2. The memory unit of claim 1, wherein the first memory cell further comprises:
   a first word line transistor having a first terminal coupled to the second terminal of the first floating gate transistor, a second terminal configured to receive the third voltage, and a control terminal configured to receive a word line signal;
   wherein:
   during the program operation of the memory unit, the word line signal is in a range from the fourth voltage to the third voltage; and
   during the program inhibit operation of the memory unit, the word line signal is in a range from the fourth voltage to the third voltage.

3. The memory unit of claim 2, wherein the first word line transistor has a low threshold voltage.

4. The memory unit of claim 1, wherein the first memory cell further comprises:
   a second capacitance element coupled to the floating gate of the first floating gate transistor and configured to receive at least a second control signal;
   wherein:
   during the program operation of the memory unit, the second control signal is at the first voltage; and
   during the program inhibit operation of the memory unit, the second control signal is at the first voltage.

5. A memory unit comprising:
   a first voltage passing device configured to output voltages according to operations of the memory unit, the first voltage passing device comprising a first passing gate transistor having a first terminal configured to receive an inhibit signal, a second terminal, and a control terminal configured to receive a passing gate control signal; and
   a first memory cell comprising:
      a first floating gate transistor having a first terminal configured to receive a first bit line signal, a second terminal, and a floating gate; and
      a first capacitance element having a first terminal coupled to the second terminal of the first passing gate transistor, a second terminal, a control terminal coupled to the floating gate of the first floating gate transistor, and a body configured to receive a first control signal;
   wherein:
   the first capacitance element and the first voltage passing device are disposed in a first N-well;
   the first terminal of the first capacitance element receives a first voltage outputted from the first voltage passing device during a program operation or an erase operation of the first memory cell and receives a second voltage outputted from the first voltage passing device during an inhibit operation of the first memory cell;
   the first voltage is greater than the second voltage;
   during the erase operation of the memory unit, the first control signal is at the first voltage, the first bit line signal is in a range from a fourth voltage to a third voltage, the inhibit signal is at the first voltage, the passing gate control signal is at a fifth voltage, and the first terminal of the first passing gate transistor receives the first voltage;
   during an erase inhibit operation of the memory unit, the first control signal is at the first voltage, the first bit line signal is in a range from the fourth voltage to the third voltage, the inhibit signal is at the second voltage, the passing gate control signal is at the fifth voltage, and the first terminal of the first passing gate transistor receives the second voltage; and the third voltage is smaller than the fourth voltage, the fourth voltage is smaller than the fifth voltage, and the fifth voltage is smaller than the second voltage.

6. The memory unit of claim 5, wherein the first memory cell further comprises:

a first word line transistor having a first terminal coupled to the second terminal of the first floating gate transistor, a second terminal configured to receive the third voltage, and a control terminal configured to receive a word line signal;

wherein:

during the erase operation of the memory unit, the word line signal is in a range from the fourth voltage to the third voltage; and during the erase inhibit operation of the memory unit, the word line signal is in a range from the fourth voltage to the third voltage.

7. The memory unit of claim 6, wherein the first word line transistor has a low threshold voltage.

8. The memory unit of claim 5, wherein the first memory cell further comprises:

a second capacitance element coupled to the floating gate of the first floating gate transistor and configured to receive at least a second control signal;

wherein:

during the erase operation of the memory unit, the second control signal is at the third voltage; and during the erase inhibit operation of the memory unit, the second control signal is at the third voltage.

9. A memory unit comprising:

a first voltage passing device configured to output voltages according to operations of the memory unit, the first voltage passing device comprising:

a first passing gate transistor having a first terminal configured to receive an inhibit signal, a second terminal, and a control terminal configured to receive a first passing gate control signal; and a second passing gate transistor having a first terminal, a second terminal configured to receive a first voltage or a first control signal, and a control terminal configured to receive a second passing gate control signal; and a first memory cell comprising:

a first floating gate transistor having a first terminal configured to receive a first bit line signal, a second terminal, and a floating gate; and a first capacitance element having a first terminal coupled to the second terminal of the first passing gate transistor, a second terminal coupled to the first terminal of the second passing gate transistor, a control terminal coupled to the floating gate of the first floating gate transistor, and a body configured to receive the first control signal;

wherein:

the first capacitance element and the first voltage passing device are disposed in a first N-well;

the first terminal of the first capacitance element receives a first voltage outputted from the first voltage passing device during a program operation or an erase operation of the first memory cell and receives a second voltage outputted from the first voltage passing device during an inhibit operation of the first memory cell; and the first voltage is greater than the second voltage.

10. The memory unit of claim 9, wherein:

during the program operation of the memory unit, the first control signal is at the first voltage, the first bit line signal is in a range from a fourth voltage to a third voltage, the inhibit signal is at the second voltage, the first passing gate control signal is at the first voltage, and the second passing gate control signal is at a fifth voltage;

during a program inhibit operation of the memory unit, the first control signal is at the first voltage, the first bit line signal is in a range from the fourth voltage to the third voltage, the inhibit signal is at the second voltage, the first passing gate control signal is at the fifth voltage, and the second passing gate control signal is at the first voltage; and the third voltage is smaller than the fourth voltage, the fourth voltage is smaller than the fifth voltage, and the fifth voltage is smaller than the second voltage.

11. The memory unit of claim 10, wherein the first memory cell further comprises:

a first word line transistor having a first terminal coupled to the second terminal of the first floating gate transistor, a second terminal configured to receive the third voltage, and a control terminal configured to receive a word line signal;

wherein:

during the program operation of the memory unit, the word line signal is in a range from the fourth voltage to the third voltage; and during the program inhibit operation of the memory unit, the word line signal is in a range from the fourth voltage to the third voltage.

12. The memory unit of claim 10, wherein the first memory cell further comprises:

a second capacitance element coupled to the floating gate of the first floating gate transistor and configured to receive at least a second control signal;

wherein:

during the program operation of the memory unit, the second control signal is at the first voltage; and during the program inhibit operation of the memory unit, the second control signal is at the first voltage.

13. The memory unit of claim 9, wherein:

during the erase operation of the memory unit, the first control signal is at the first voltage, the first bit line signal is in a range from a fourth voltage to a third voltage, the inhibit signal is at the second voltage, the first passing gate control signal is at the first voltage, and the second passing gate control signal is at a fifth voltage;

during an erase inhibit operation of the memory unit, the first control signal is at the first voltage, the first bit line signal is in a range from the fourth voltage to the third voltage, the inhibit signal is at the second voltage, the first passing gate control signal is at the fifth voltage, and the second passing gate control signal is at the first voltage; and the third voltage is smaller than the fourth voltage, the fourth voltage is smaller than the fifth voltage, and the fifth voltage is smaller than the second voltage.

14. The memory unit of claim 13, wherein the first memory cell further comprises:

a first word line transistor having a first terminal coupled to the second terminal of the first floating gate transistor, a second terminal configured to receive the third voltage, and a control terminal configured to receive a word line signal;

wherein:
during the erase operation of the memory unit, the word line signal is in a range from the fourth voltage to the third voltage; and
during the erase inhibit operation of the memory unit, the word line signal is in a range from the fourth voltage to the third voltage.

15. The memory unit of claim 13, wherein the first memory cell further comprises:
a second capacitance element coupled to the floating gate of the first floating gate transistor and configured to receive at least a second control signal;
wherein:
during the erase operation of the memory unit, the second control signal is at the third voltage; and
during the erase inhibit operation of the memory unit, the second control signal is at the third voltage.

16. The memory unit of claim 9, wherein:
the first memory cell further comprises:
a first word line transistor having a first terminal coupled to the second terminal of the first floating gate transistor, a second terminal configured to receive a third voltage, and a control terminal configured to receive a word line signal; and
a second capacitance element coupled to the floating gate of the first floating gate transistor and configured to receive at least a second control signal; and
the memory unit further comprises:
a second voltage passing device, comprising:
a third passing gate transistor having a first terminal configured to receive the inhibit signal, a second terminal, and a control terminal configured to receive the second passing gate control signal; and
a fourth passing gate transistor having a first terminal, a second terminal configured to receive the first voltage or the first control signal, and a control terminal configured to receive the first passing gate control signal; and
a second memory cell, comprising:
a third capacitance element coupled to the second terminal of the third passing gate transistor and the first terminal of the fourth passing gate transistor, and configured to receive the first control signal and voltages outputted from the second voltage passing device;
a fourth capacitance element configured to receive the second control signal;
a second floating gate transistor having a first terminal configured to receive a second bit line signal, a second terminal, and a floating gate coupled to the third capacitance element and the fourth capacitance element; and
a second word line transistor having a first terminal coupled to the second terminal of the second floating gate transistor, a second terminal configured to receive the third voltage, and a control terminal configured to receive the word line signal.

17. A memory unit, comprising:
a first voltage passing device configured to output voltages according to operations of the memory unit;
a first memory cell comprising:
a first floating gate transistor having a first terminal configured to receive a first bit line signal, a second terminal, and a floating gate;
a first capacitance element having a first terminal coupled to the first voltage passing device, a second terminal, a control terminal coupled to the floating gate of the first floating gate transistor, and a body configured to receive a first control signal;
a word line transistor having a first terminal coupled to the second terminal of the first floating gate transistor, a second terminal configured to receive a third voltage, and a control terminal configured to receive a word line signal; and
a second capacitance element coupled to the floating gate of the first floating gate transistor and configured to receive at least a second control signal; and
N additional memory cells, each comprising:
an additional first capacitance element;
an additional second capacitance element;
an additional floating gate transistor having a first terminal configured to receive a corresponding bit line signal, a second terminal, and a floating gate coupled to the additional first capacitance element and the additional second capacitance element; and
an additional word line transistor having a first terminal coupled to the second terminal of the additional floating gate transistor, a second terminal configured to receive a third voltage, and a control terminal configured to receive a corresponding word line signal;
wherein:
N is a positive integer;
the first capacitance element and the first voltage passing device are disposed in a first N-well;
the first terminal of the first capacitance element receives a first voltage outputted from the first voltage passing device during a program operation or an erase operation of the first memory cell and receives a second voltage outputted from the first voltage passing device during an inhibit operation of the first memory cell; and
the first voltage is greater than the second voltage.

18. The memory unit of claim 17, wherein:
the first voltage passing device comprises a first passing gate transistor having a first terminal configured to receive an inhibit signal, a second terminal coupled to the first terminal of the first capacitance element, and a control terminal configured to receive a passing gate control signal; and
the N additional first capacitance elements of the N additional memory cells are transistors coupled in series with the first capacitance element.

19. The memory unit of claim 17, wherein:
the first voltage passing device comprises a first passing gate transistor having a first terminal configured to receive an inhibit signal, a second terminal coupled to the first terminal of the first capacitance element, and a control terminal configured to receive a passing gate control signal; and
each of the N additional first capacitance elements has a first terminal coupled to the first terminal of the first capacitance element, a second terminal coupled to the second terminal of the first capacitance element, and a control terminal coupled to the floating gate of the additional floating gate transistor.

20. The memory unit of claim 17, wherein:
the first voltage passing device comprises:
a first passing gate transistor having a first terminal configured to receive an inhibit signal, a second terminal coupled to the first terminal of the first capacitance element, and a control terminal configured to receive a first passing gate control signal; and a second passing gate transistor having a first terminal, a second terminal configured to receive the first voltage or the first control signal, and a control terminal configured to receive a second passing gate control signal; and the N additional first capacitance elements of the N additional memory cells are transistors coupled in series between the second terminal of the first capacitance element and the first terminal of the second passing gate transistor.

21. The memory unit of claim 17, wherein:
the first voltage passing device comprises:
a first passing gate transistor having a first terminal configured to receive an inhibit signal, a second terminal coupled to the first terminal of the first capacitance element, and a control terminal configured to receive a first passing gate control signal; and
a second passing gate transistor having a first terminal, a second terminal configured to receive the first voltage or the first control signal, and a control terminal configured to receive a second passing gate control signal; and
each of the N additional first capacitance elements has a first terminal coupled to the first terminal of the first capacitance element, a second terminal coupled to the first terminal of the second passing gate transistor, and a control terminal coupled to the floating gate of the additional floating gate transistor.

22. A memory unit, comprising:
a first voltage passing device configured to output voltages according to operations of the memory unit;
a first memory cell comprising:
a first floating gate transistor having a first terminal configured to receive a first bit line signal, a second terminal, and a floating gate; and
a first capacitance element having a first terminal coupled to the first voltage passing device, a second terminal, a control terminal coupled to the floating gate of the first floating gate transistor, and a body configured to receive a first control signal;
a second voltage passing device configured to output a first voltage during a program operation or an erase operation of the memory unit and output a second voltage during an inhibit operation of the memory unit; and
a second capacitance element coupled to the floating gate of the first floating gate transistor and the second voltage passing device, and configured to receive voltages outputted from the second voltage passing device;
wherein:
the first capacitance element and the first voltage passing device are disposed in a first N-well;
the first terminal of the first capacitance element receives the first voltage outputted from the first voltage passing device during the program operation or the erase operation of the first memory cell and receives the second voltage outputted from the first voltage passing device during the inhibit operation of the first memory cell; and
the first voltage is greater than the second voltage.

23. A memory array, comprising:
at least one row of memory units, each memory unit in a same row comprising:
a first voltage passing device configured to receive an inhibit signal, and output voltages according to a first passing gate control signal;
a second voltage passing device configured to receive the inhibit signal, and output voltages according to a second passing gate control signal;
a first memory cell, comprising:
a first floating gate transistor having a first terminal configured to receive a first bit line signal, a second terminal, and a floating gate;
a first capacitance element having a first terminal coupled to the first voltage passing device, a second terminal, a control terminal coupled to the floating gate of the first floating gate transistor, and a body configured to receive a first control signal;
a first word line transistor having a first terminal coupled to the second terminal of the first floating gate transistor, a second terminal configured to receive a third voltage, and a control terminal configured to receive a word line signal; and
a second capacitance element coupled to the floating gate of the first floating gate transistor, and configured to receive a second control signal; and
a second memory cell, comprising:
a second floating gate transistor having a first terminal configured to receive a second bit line signal, a second terminal, and a floating gate;
a third capacitance element having a first terminal coupled to the second voltage passing device, a second terminal, a control terminal coupled to the floating gate of the second floating gate transistor, and a body configured to receive the first control signal;
a second word line transistor having a first terminal coupled to the second terminal of the second floating gate transistor, a second terminal configured to receive the third voltage, and a control terminal configured to receive the word line signal; and
a fourth capacitance element coupled to the floating gate of the second floating gate transistor, and configured to receive the second control signal;
wherein:
memory units in a same row receive a same inhibit signal, a same first control signal, a same second control signal, and a same word line signal;
memory units in the same row receive different first bit line signals, different second bit line signals, different first passing gate control signals, and different second passing gate control signals.

24. The memory array of claim 23, wherein:
memory units in different rows receive different inhibit signals, different first control signals, different second control signals, and different word line signals; and
memory units in different rows but in a same column receive a same first bit line signal, a same second bit line signal, a same first passing gate control signal, and a same second passing gate control signal.

* * * * *